(12) United States Patent
Kawauchi et al.

(10) Patent No.: US 7,521,861 B2
(45) Date of Patent: Apr. 21, 2009

(54) ELECTROLUMINESCENCE ELEMENT

(75) Inventors: Hiroyasu Kawauchi, Kariya (JP);
Masayuki Harada, Kariya (JP);
Norihito Takeuchi, Kariya (JP); Masato Hieda, Kariya (JP)

(73) Assignee: Kabushiki Kaisha Toyota Jidoshokki, Kariya-shi (JP)

( * ) Notice: Subject to any disclaimer, the term of this patent is extended or adjusted under 35 U.S.C. 154(b) by 451 days.

(21) Appl. No.: 11/316,089

(22) Filed: Dec. 21, 2005

(65) Prior Publication Data
US 2006/0214157 A1 Sep. 28, 2006

(30) Foreign Application Priority Data
Dec. 24, 2004 (JP) .............................. 2004-374360
Jun. 21, 2005 (JP) .............................. 2005-180032

(51) Int. Cl.
*H01L 29/08* (2006.01)
(52) U.S. Cl. ................. 313/506; 313/504; 313/505; 313/498; 257/40
(58) Field of Classification Search ......... 313/495–512, 313/491, 494; 315/169.3, 169.4; 257/40, 257/79; 428/690; 345/30, 36, 44, 45
See application file for complete search history.

(56) References Cited

U.S. PATENT DOCUMENTS

| | | | |
|---|---|---|---|
| 5,936,344 A * | 8/1999 | Nagayama | 313/506 |
| 5,949,186 A * | 9/1999 | Nagayama et al. | 313/504 |
| 6,538,374 B2 | 3/2003 | Hosokawa | |
| 6,781,162 B2 | 8/2004 | Yamazaki et al. | |
| 7,196,466 B2 | 3/2007 | Hieda et al. | |
| 2003/0047730 A1 * | 3/2003 | Konuma | 257/42 |

FOREIGN PATENT DOCUMENTS

| | | |
|---|---|---|
| JP | 6-132079 | 5/1994 |
| JP | 09-292623 | 11/1997 |
| JP | 2003-123990 | 4/2003 |
| JP | 2004-296297 | 10/2004 |
| KR | 20050021888 | 3/2005 |

OTHER PUBLICATIONS

Korean Office Action dated Jun. 22, 2007, received in corresponding Korean Patent Application No. KR102005002 1888 A without English translation.
Taiwanese Office Action dated Jun. 17, 2008, received in corresponding Taiwanese Patent Application No. 0972030644001 without English translation.
Chinese Office Action dated Aug. 29, 2008, received in corresponding Chinese Patent Application No. 200510135835.9 with English translation.

* cited by examiner

*Primary Examiner*—Joseph L Williams
*Assistant Examiner*—Elmito Breval
(74) *Attorney, Agent, or Firm*—Locke Lord Bissell & Liddell

(57) ABSTRACT

An electroluminescence element includes a first electrode, a second electrode, and a light emission layer arranged between the first electrode and the second electrode. The first electrode is formed of a material having a higher volume resistivity than that of the material of the second electrode. A connector portion electrically connects a feeder portion to the first electrode. The resistance value of the connector portion differs in correspondence with a position at which the connector portion connects the feeder portion to the first electrode. The brightness distribution of the electroluminescence element is thus adjusted to a desired state.

21 Claims, 10 Drawing Sheets

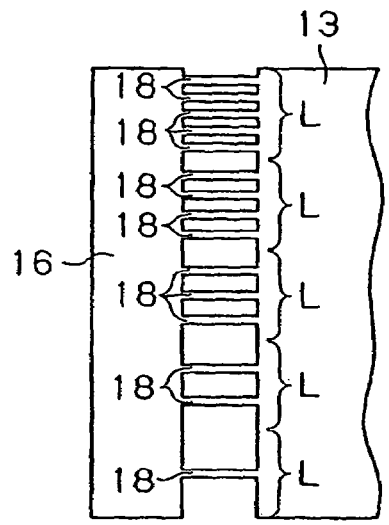
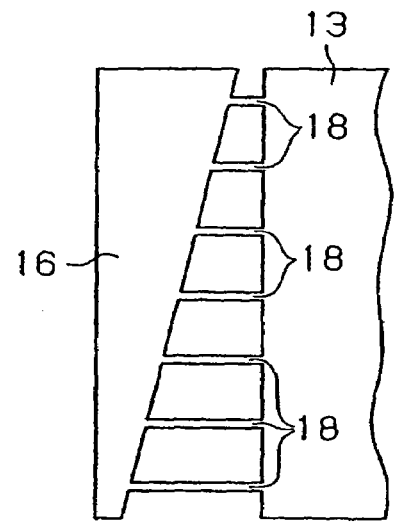
Fig.11A  Fig.11B
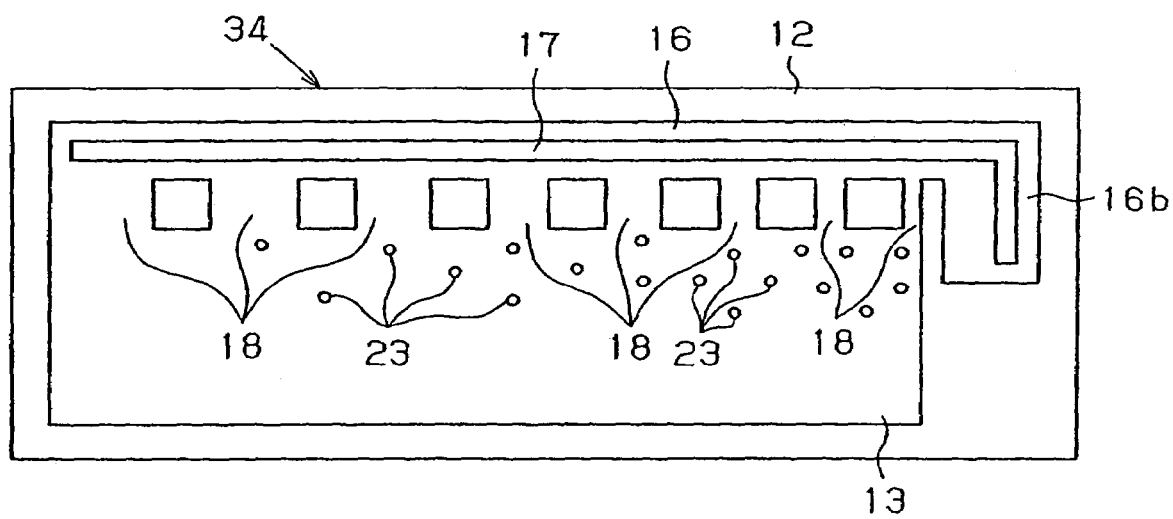
Fig.12

ELECTROLUMINESCENCE ELEMENT

BACKGROUND OF THE INVENTION

The present invention relates to electroluminescence elements.

Organic electroluminescence elements (hereinafter, referred to as "organic EL elements") are employed in displays and lighting devices as light emission elements. One such element basically includes an anode electrode layer, an organic light emission layer, and a cathode electrode layer, which are deposited on a transparent substrate formed of, for example, glass in this order.

The organic EL element emits light when voltage is applied between the anode electrode layer and the cathode electrode layer and thus an electric current flows in the organic light emission layer. Typically, the light emitted by the organic light emission layer passes through an electrode of the anode or cathode electrode layer and is thus sent to the exterior. In this case, at least the electrode through which the light passes is formed by a transparent electrode that transmits the light. The transparent electrode is formed of, typically, ITO (indium tin oxide) or ZnO (zinc oxide), which has a higher volume resistivity than that of an electrode formed of metal, such as aluminum or silver.

The brightness of the organic EL element is influenced by the current density of the organic light emission layer and becomes greater as the current density becomes higher. If the transparent electrode is formed of ITO, the difference between the electric resistance value from a power supply terminal to a portion of the electrode closer to the power supply terminal and the electric resistance value from the power supply terminal to a portion of the electrode far from the power supply terminal becomes relatively large. This results in a relatively great difference between the current densities of the corresponding portions of the organic light emission layer. Accordingly, the brightness of the light emission zone of the organic EL element may become non-uniform.

In one method of adjusting the brightness distribution of the organic EL element, as described in Japanese Laid-Open Patent Publication No. 2003-123990, a transparent electrode is combined with an auxiliary electrode that is formed of metal with relatively high electric conductivity. More specifically, as shown in FIG. 15, the method employs an auxiliary electrode 52 including a contact portion. The contact portion has three sides that are held in contact with a transparent anode electrode layer 51, which is deposited on a substrate 50.

In this method, the auxiliary electrode 52 is provided around the transparent anode electrode layer 51. The brightness distribution of the organic EL element is thus adjusted by lowering the electric resistance of a portion of the transparent anode electrode layer 51 corresponding to the auxiliary electrode 52. However, even in the auxiliary electrode 52, the difference between the electric resistance value from a power supply terminal to a portion of the auxiliary electrode 52 closer to the power supply terminal and the electric resistance value from the power supply terminal to a portion of the auxiliary electrode 52 far from the power supply terminal becomes relatively large. This decreases the current density of a portion of the organic light emission layer far from the power supply terminal, lowering the brightness of the portion correspondingly.

Similar problems occur also in inorganic EL elements.

SUMMARY OF THE INVENTION

Accordingly, it is an objective of the present invention to provide an EL element having a novel structure for adjusting the brightness distribution of the EL element to a desired state. The "desired state" of the brightness distribution herein is defined as a substantially uniform state or a state focally different in a desired portion (zone) of a light emission zone of the EL element.

To achieve the above objective, the present invention provides an electroluminescence element including a first electrode, a second electrode, and a light emission layer arranged between the first and second electrodes. The first electrode is formed of a material having a higher volume resistivity than that of the material of the second electrode. A connector portion electrically connects a feeder portion to the first electrode. The resistance value of the connector portion differs in correspondence with a position at which the connector portion connects the feeder portion to the first electrode.

The present invention also provides an electroluminescence element including a first conductive layer, a light emission layer deposited on the first conductive layer, and a second conductive layer formed on the light emission layer. The first conductive layer has a terminal portion that can be connected to an external driver circuit. The first conductive layer is formed of a material having a higher volume resistivity than that of the material of the second conductive layer. An auxiliary electrode layer is provided in correspondence with a portion of the first conductive layer. The auxiliary electrode layer is formed of a material having a lower volume resistivity than that of the material of the first conductive layer. A high resistance portion is formed of a material having a higher volume resistivity than that of the material of the first conductive layer. The high resistance portion is arranged between the first conductive layer and the auxiliary electrode layer and adjacent to a portion of the light emission layer, extending along a side of the light emission layer. The high resistance portion has a length defined along a direction in which the side of the light emission layer extends and a width perpendicular to the length. The width of the high resistance portion differs in correspondence with the distance between the high resistance portion and the terminal portion.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages. thereof, may best be understood by reference to the following description of the presently preferred embodiments together with the accompanying drawings in which:

FIG. 11A is a plan view showing a portion including a feeder portion, a first electrode, and connector portions according to another embodiment of the present invention;

FIG. 11B is a plan view showing a portion including a feeder portion, a first electrode, and connector portions according to another embodiment of the present invention;

FIG. 12 is a plan view showing an organic EL element according to another embodiment of the present invention;

DETAILED DESCRIPTION OF THE PREFERRED EMBODIMENTS

An organic EL element 11 according to a first embodiment of the present invention will hereafter be described with reference to FIGS. 1 to 3. In the first embodiment, the desired state of the brightness distribution of the organic EL element 11 corresponds to the substantially uniform state.

Figure 1A:
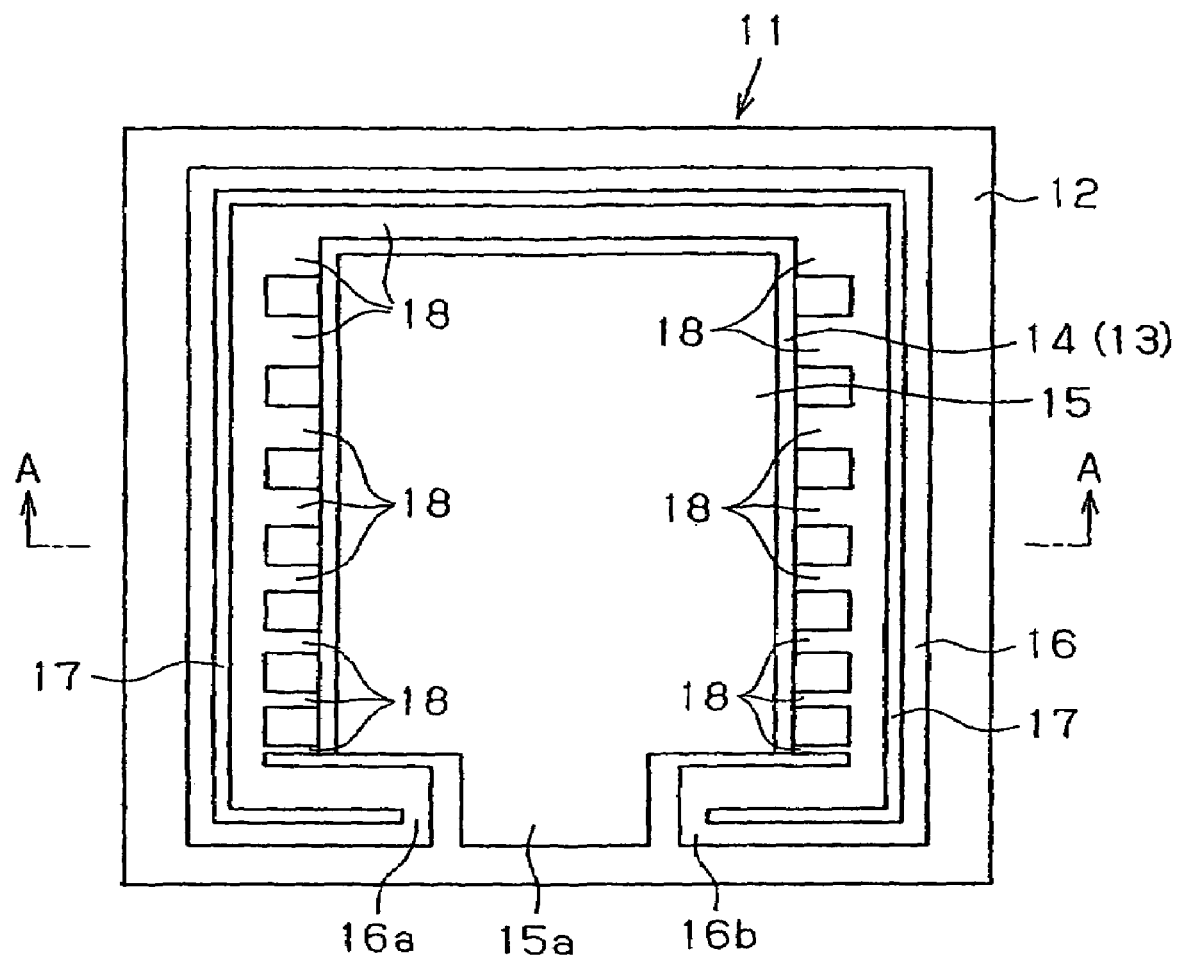
FIG. 1A is a plan view showing an organic EL element according to a first embodiment of the present invention.
Figure 1B:
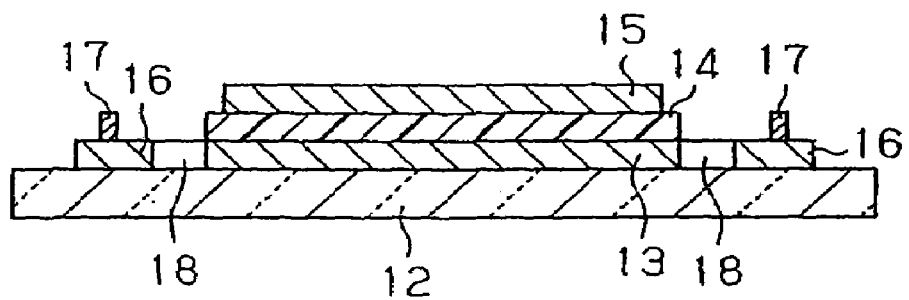
FIG. 1B is a cross-sectional view taken along line A-A of FIG. 1A.
Figure 2:
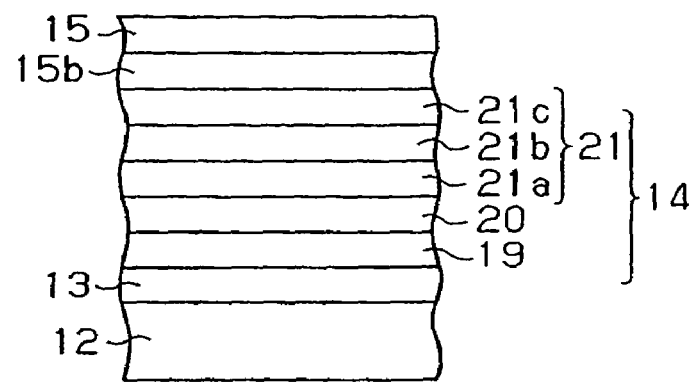
FIG. 2 is a partial view showing the structure of an organic light emission layer of the organic EL element of FIG. 1A.

As shown in FIGS. 1A and 1B, the organic EL element 11 has a first electrode 13, an organic light emission layer 14 serving as a light emission layer, and a second electrode 15, which are deposited on a substantially rectangular substrate 12 in this order. The organic EL element 11 further includes a feeder portion 16, an auxiliary electrode 17, and a plurality of connector portions 18. The first electrode 13, the organic light emission layer 14, the second electrode 15, the feeder portion 16, the auxiliary electrode 17, and a portion defining the connector portions 18 as a whole, each are formed to be symmetric with respect to the lateral midline of the first electrode 13 (as viewed to the right or left in FIG. 1A). Further, each of the drawings is only a schematic illustration and the components are shown in exaggerated dimensions for the illustrative purposes. The dimensional proportions of the components, including widths, lengths, and thicknesses, are thus not equal to the actual values.

Each of the first electrode 13, the organic light emission layer 14, and the second electrode 15 has a substantially rectangular shape. The organic light emission layer 14 and the first electrode 13 have substantially equal surface areas. The second electrode 15 has a smaller surface area than that of the organic light emission layer 14 for preventing a short circuit between the second electrode 15 and the first electrode 13. In the first embodiment, the first electrode 13 corresponds to an anode and the second electrode 15 corresponds to a cathode. The second electrode 15 has a terminal portion 15a formed in one side of the second electrode 15. The terminal portion 15a connects the second electrode 15 to an external driver circuit (non-illustrated).

The feeder portion 16 is formed on the substrate 12, extending along the outer circumference of the first electrode 13. The width of the feeder portion 16 is uniform. Two terminal portions 16a, 16b are formed at opposing ends of the feeder portion 16 for connecting the feeder portion 16 to a driver circuit (non-illustrated). The terminal portions 16a, 16b of the feeder portion 16 and the terminal portion 15a of the second electrode 15 are aligned along one side of the organic EL element 11. In this state, the terminal portion 15a is arranged between the terminal portions 16a and 16b.

The auxiliary electrode 17 is mounted on the feeder portion 16, extending along the outline of the feeder portion 16. The auxiliary electrode 17 is formed of a material having a lower volume resistivity than that of the feeder portion 16. The width of the auxiliary electrode 17 is uniform and smaller than the width of the feeder portion 16 for preventing the auxiliary electrode 17 from projecting from the feeder portion 16 and causing a short circuit with the second electrode 15.

The feeder portion 16 and the first electrode 13 are electrically connected to each other through the connector portions 18, which are provided on the substrate 12. In the first embodiment, the connector portions 18 are formed in such a manner that, when a DC drive voltage is applied between the feeder portion 16 and the second electrode 15, substantially equal potentials are caused in an outer circumferential portion of the first electrode 13. More specifically, the connector portions 18 are arranged in correspondence with the right side and the left side of the first electrode 13, as viewed in FIG. 1A. The central axes of the connector portions 18 are spaced apart at equal interval. For the illustrative purposes, the connector portions 18 are spaced apart at equal interval in FIG. 1A. Further, the connector portions 18 have uniform lengths and uniform thicknesses. However, the widths of the connector portions 18 are different in correspondence with the distances between the connector portions 18 and the corresponding one of the terminal portions 16a and 16b. The "length of each connector portion 18" herein corresponds to the distance (the dimension) between the feeder portion 16 and the first electrode 13, as referred to as "a first dimension". The "width of each connector portion 18" corresponds to the dimension of the connector portion 18 perpendicular to the direction defined by the length of the connector portion 18, as referred to as "a second dimension". More specifically, the connector portions 18 closest to the corresponding terminal portions 16a, 16b have minimum widths. The widths of the connector portions 18 become greater as the connector portions 18 become farther from the corresponding terminal portions 16a, 16b. Further, a side of the first electrode 13 opposed to the side corresponding to the terminal portions 15a, 16a, 16b is entirely connected to the corresponding connector portion 18, the width of which is adjusted appropriately. Portions defined between the feeder portion 16 and the first electrode 13 that do not correspond to the connector portions 18 are non-conductive, thus preventing an electric current from flowing from the feeder portion 16 to the first electrode 13.

In the first embodiment, the organic EL element 11 is formed of a bottom-emission type in which the light emitted by the organic light emission layer 14 exits from the substrate 12. In other words, the substrate 12 functions as a light exit surface. Accordingly, the substrate 12 is formed of a material that transmits the visible light, for example, glass.

The first electrode 13 is a transparent electrode and is formed of an ITO film that exhibits a relatively high transmission rate for the visible light. The ITO has a higher volume resistivity than that of metal such as aluminum or silver. The feeder portion 16 and the connector portions 18 are formed of the same material as that of the first electrode 13, or the ITO. Each of the connector portions 18 is defined by providing a corresponding slit in the ITO film.

The organic light emission layer 14 is formed of an organic layer including at least a light emission layer. For example, with reference to FIG. 2, the organic light emission layer 14 has a five-layered structure including a hole injection layer 19, a hole transport layer 20, a first light emission layer 21a, a second light emission layer 21b, and a third light emission layer 21c. The first to third light emission layers 21a to 21c, which define a light emission layer 21, are deposited on the hole transport layer 20. That is, in the first embodiment, the organic light emission layer 14 is formed by an organic layer including the hole injection layer 19 and the hole transport layer 20, as well as the light emission layer 21. Further, an electron injection layer 15b formed of lithium fluoride (LiF) is provided between the third light emission layer 21c and the second electrode 15.

The light emission layer 21 is formed as a white light emission layer by depositing the first light emission layer 21a which is a red light emission layer, the second light emission layer 21b which is a blue light emission layer, and the third light emission layer 21c which is a green light emission layer, on the hole transport layer 20 in this order.

The first light emission layer 21a is formed of TPTE as a host and DCJT as a dopant and has a thickness of 5 nm. The content of DCJT is 0.5 weight percent with respect to TPTE. DCJT is represented by the following formula.

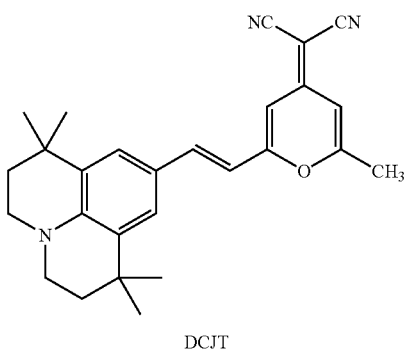

DCJT

The second light emission layer 21b is formed of DPVBi as a host and BCzVBi as a dopant and has a thickness of 30 nm. The content of BCzVBi is 5.0 weight percent with respect to DPVBi.

The third light emission layer 21c is formed of Alq3 as a host and C545T (a product name of Eastman-Kodak Company) as a dopant and has a thickness of 20 nm The content of C545T is 1.0 weight percent with respect to Alq3.

The second electrode 15 is formed of a metal that reflects the light emitted by the organic light emission layer 14, which is, for example, aluminum in the first embodiment. The auxiliary electrode 17, which is mounted on the feeder portion 16, is formed of a metal having greater conductivity, which is, for example, the same material as that of the second electrode 15 (aluminum) in this embodiment.

A protector portion (not shown) is provided in the exterior of the second electrode 15 to protect the organic light emission layer 14 from oxygen and moisture. The protector portion is formed by, for example, a passivation film or a sealing can.

A method of fabricating the organic EL element 11, which is configured as above-described, will hereafter be explained. To fabricate the organic EL element 11, an ITO film is first deposited on the substrate 12. Such deposition is performed by a heretofore known thin film deposition method such as spattering, vacuum vapor deposition, and ionization deposition. Next, etching is carried out on the ITO film and thus the first electrode 13, the feeder portion 16, the terminal portions 16a, 16b, and the connector portions 18 are provided.

Subsequently, the organic light emission layer 14 is formed on the first electrode 13. More specifically, the organic light emission layer 14 is formed through, for example, vacuum vapor deposition by sequentially providing the layers that consist the organic light emission layer 14. Then, the second electrode 15 is formed on the organic light emission layer 14 and the auxiliary electrode 17 is formed on the feeder portion 16 through vacuum vapor deposition. In other words, the second electrode 15 and the auxiliary electrode 17 are formed at one time. Finally, the protector portion is provided. If a ceramic film of silicon nitride or the like is employed as the protector portion, the plasma CVD method, for example, may be used for forming the film.

The operation of the organic EL element 11 will now be described. The organic EL element 11 may function as an area light-emitting element and thus be used as, for example, a backlight of a liquid crystal display or a lighting device.

The organic EL element 11 operates with the terminal portions 16a, 16b, 15a connected to the external driver circuits (non-illustrated). When a DC drive voltage is applied between the feeder portion 16 and the second electrode 15, a current flows from the feeder portion 16 to the first electrode 13 via the connector portions 18. And the current flows from the first electrode 13 to the organic light emission layer 14, and the second electrode 15. In this state, the organic light emission layer 14 emits light and the light transmits through the first electrode 13, which is a transparent electrode. The light then exits from the substrate 12 to the exterior.

Figure 3:
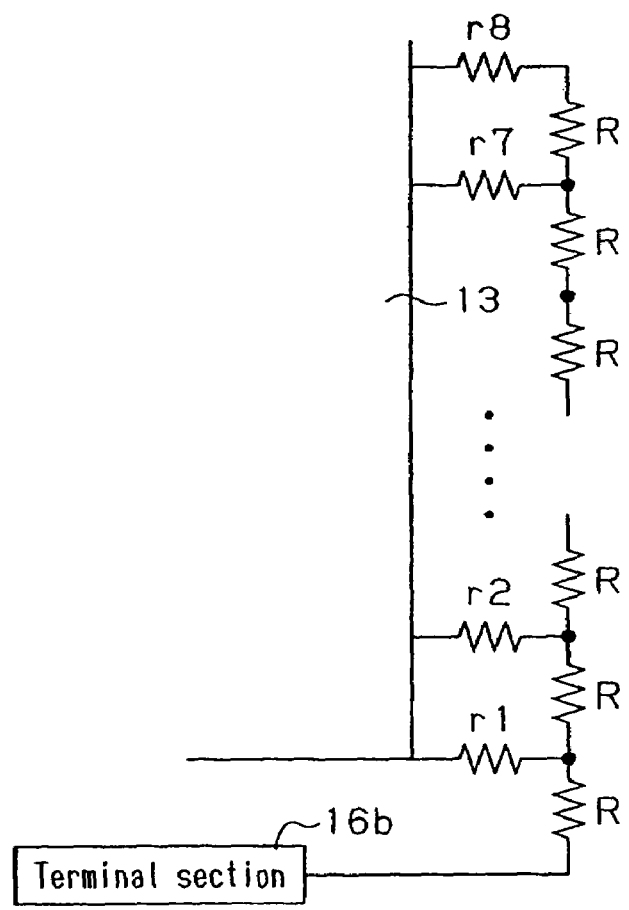
FIG. 3 is a diagram representing an equivalent circuit of a feeder portion and connector portions of the organic EL element of FIG. 1A.

FIG. 3 is a diagram of an equivalent circuit representing resistance values of the feeder portion 16 and the connector portions 18 at one of the opposing sides of the organic EL element 11 of FIG. 1A. In the diagram, the index R represents a resistance value of a portion of the feeder portion 16 corresponding to a section between the central axes of the adjacent connector portions 18. The indices r1 to r8 each represent the resistance value of the corresponding one of the connector portions 18. In the first embodiment, the central axes of the connector portions 18 are spaced at the equal interval. Further, the width of the feeder portion 16 is uniform. The resistances R thus become equal. Also, the auxiliary electrode 17, which is formed of the material with lower volume resistivity, is mounted on the feeder portion 16. Thus, the resistances R are sufficiently small compared to the resistances r1 to r8 of the connector portions 18. This makes it easy to set the resistances r1 to r8 in such a manner that, when the DC drive voltage is applied between the feeder portion 16 and the second electrode 15, the amounts of the currents flowing into each of the connector portions 18 become substantially equal.

Further, as the connector portions 18 are located closer to the corresponding terminal portions 16a, 16b, the total resistances of the current paths between the connector portions 18 and the terminal portions 16a, 16b become smaller, which facilitates a current flow in the connector portions 18. In the first embodiment, the resistance values of the connector portions 18 become smaller as the connector portions 18 are farther from the corresponding terminal portions 16a, 16b. Thus, the potentials of the outer circumferential portion of the first electrode 13 become substantially equal. Accordingly, the brightness distribution of the organic EL element 11 as a whole becomes substantially uniform.

To determine whether or not the brightness distribution of the organic EL element 11 is substantially uniform (as a whole), the light emitting zone of the organic EL element 11 is divided into a plurality of unit zones as viewed from the side corresponding to the light exit surface. The minimum brightness value of the unit zones is divided by the maximum brightness value of the unit zones. The result is multiplied by 100, thus obtaining a percentage. At 60 percent or more, it is determined that the brightness distribution of the organic EL element 11 (as a whole) is substantially uniform. As the percentage becomes greater, the uniformity of the brightness distribution increases. At 100 percent, the brightness distribution becomes uniform. Further, the surface area of each unit zone is, for example, several square millimeters.

The first embodiment has the following advantages.

(1) The organic EL element 11 has the first electrode 13, the organic light emission layer 14, the second electrode 15, and the feeder portion 16. The organic light emission layer 14 is arranged between the first electrode 13 and the second electrode 15. The first electrode 13 is formed of the material having a higher volume resistivity than that of the second electrode 15. The feeder portion 16 and the first electrode 13 are electrically connected to each other through the connector portions 18. The resistance values of the connector portions 18 are different in correspondence with the positions at which the connector portions 18 connect the feeder portion 16 to the first electrode 13. This adjusts the potentials of the connection areas in which the corresponding connector portions 18 are connected to the first electrode 13. In this manner, the brightness distribution of the organic EL element 11 is adjusted to the desired state. The organic EL element 11 is preferably used in displays and lighting devices and may be used as, for example, a backlight of a liquid crystal display.

(2) Each of the connector portions 18 is formed of the same material as that of the first electrode 13. The connector portions 18 and the first electrode 13 are thus formed at one time when the organic EL element 11 is fabricated. This decreases the number of the fabrication steps of the organic EL element 11.

(3) The material of each connector portion 18, which is the same as that of the first electrode 13, has a higher volume resistivity than that of metal such as aluminum or silver. Thus, compared to a case in which the connector portions 18 are formed of the material having a lower volume resistivity, such as aluminum or silver, the adjustable range of the resistance value of each connector portion 18 becomes larger.

(4) The feeder portion 16 is formed of the same material as that of the first electrode 13. The feeder portion 16 and the first electrode 13 are thus formed at one time when the organic EL element 11 is fabricated. The number of the fabrication steps of the organic EL element 11 thus decreases.

(5) The feeder portion 16 has the auxiliary electrode 17 that is formed of the material with a lower volume resistivity than that of the feeder portion 16. Thus, the potentials of the connection areas in which the corresponding connector portions 18 are connected to the first electrode 13 are easily adjusted by means of the connector portions 18, which are formed of the material having a higher volume resistivity.

(6) The feeder portion 16 is connected to the first electrode 13 through the connector portions 18. Thus, designing of the organic EL element 11 involves adjustment of the resistance values of the connector portions 18. This facilitates adjustment of the potentials of the connection areas in which the corresponding connector portions 18 are connected to the first electrode 13, compared to a case in which a single connector portion 18 is provided.

(7) The shapes of the connector portions 18 are different in correspondence with the distances between the connector portions 18 and the corresponding terminal portions 16a, 16b of the feeder portion 16. Thus, the resistance values of the connector portions 18 are differed in correspondence with the distances between the connector portions 18 and the corresponding terminal portions 16a, 16b, the potentials of the connection areas in which the connector portions 18 are connected to the first electrode 13 can be set.

(8) The connector portions 18 have equal length regardless of the distances between the connector portions 18 and the corresponding terminal portions 16a, 16b of the feeder portion 16. However, the connector portions 18 have different widths differed in correspondence with the distances between the connector portions 18 and the terminal portions 16a, 16b. That is, the resistance values of the connector portions 18 are adjusted only by differing the widths of the connector portions 18. Thus, as compared to a case in which the connector portions 18 are formed in different complicated shapes in such a manner as to vary the corresponding resistance values, the potentials of the connection areas in which the corresponding connector portions 18 are connected to the first electrode 13 are easily set.

(9) The resistance values of the connector portions 18 are set in such a manner that the potentials of the connection areas in which the connector portions 18 are connected to the first electrode 13 become substantially equal when the DC drive voltage is applied between the feeder portion 16 and the second electrode 15. When the DC drive voltage is applied, an electric current flows from the feeder portion 16 to the first electrode 13 through the connector portions 18. Accordingly, in the organic EL element 11, the brightness distribution is adjusted to a substantially uniform state.

A second embodiment of the present invention will hereafter be described with reference to FIGS. 4 and 5. The second embodiment is different from the first embodiment in that an organic EL element includes a non-light-emission portion. The same or similar reference numerals are given to parts of the second embodiment that are the same or similar corresponding parts of the first embodiment, and the detailed explanation of these parts will be omitted. Further, in the second embodiment, the organic EL element may be designed to have further uniform brightness distribution, compared to the first embodiment.

Figure 4:
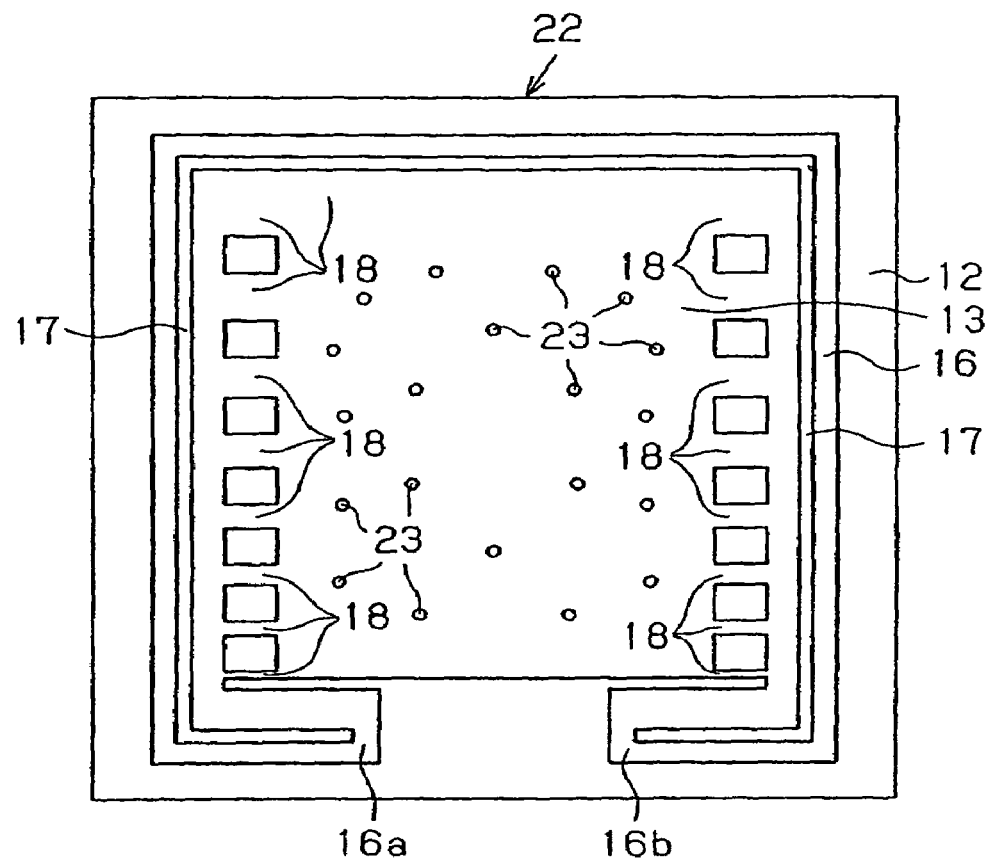
FIG. 4 is a plan view showing an organic EL element according to a second embodiment of the present invention, from which an organic light emission layer and a second electrode are removed.
Figure 5:
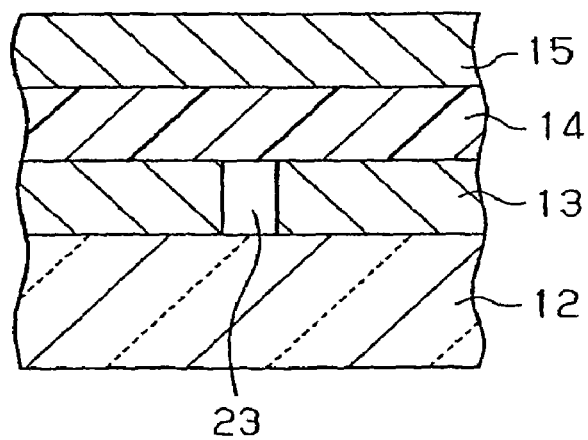
FIG. 5 is a cross-sectional view showing the structure of a non-light-emission portion of the organic EL element of FIG. 4.

FIG. 4 is a plan view showing an organic EL element 22 of the second embodiment from which the organic light emission layer 14 and the second electrode 15 are removed. FIG. 5 is a cross-sectional view showing the structure of the non-light-emission portion of the organic EL element 22, by way of example.

As shown in FIG. 4, the organic EL element 22 includes a plurality of non-light-emission portions 23. The distribution density of the non-light-emission portions 23 becomes smaller from the outer circumferential portion of the first electrode 13 towards the center. Referring to FIG. 5, the non-light-emission portions 23 are defined by not providing the first electrode 13 at the corresponding portions in the second embodiment. Further, it is preferable that the size of each of the non-light-emission portions 23 be sufficiently small so that the non-light-emission portions 23 are invisible from the exterior of the organic EL element 22.

The non-light-emission portions 23 are formed through, for example, etching, together with the first electrode 13, the feeder portion 16, and the connector portions 18, after an ITO film is deposited on the substrate 12. Alternatively, the non-light-emission portions 23 may be formed after the first electrode 13 is completed. The non-light-emission portions 23 are provided through etching or by a known microfabrication method (a removal method) such as cutting by a machine, which is performed on the first electrode 13.

In the second embodiment, the brightness distribution of the organic EL element 22 is adjusted by providing the non-light-emission portions 23, combined with adjustment of the resistance values of the connector portions 18. Like the first embodiment, when the DC drive voltage is applied, the potentials of the connection areas in which the corresponding connector portions 18 are connected to the first electrode 13 become substantially equal. Further, the distribution density of the non-light-emission portions 23 becomes smaller from the outer circumferential portion of the first electrode 13 towards the center. This suppresses the brightness in the vicinity of the outer circumferential portion of the light emission zone, thus decreasing the difference between the brightness in the outer circumferential portion of the light emission zone and the brightness at the center. The substantial uniformity of the brightness distribution of the organic EL element 22 is thus further improved.

The second embodiment has the following advantages in addition to the items (1) to (9) of the first embodiment.

(10) The organic EL element 22 has the connector portions 18 and the non-light-emission portions 23. Thus, by adjusting the resistance values of the connector portions 18 and the distribution density of the non-light-emission portions 23 in the light emission zone, the brightness distribution of the organic EL element 22 is further adjusted to the desired state.

(11) When designing the organic EL element 22, the brightness distribution of the element 22 is checked following the adjustment of the resistance values of the connector portions 18. Subsequently, the brightness distribution is further adjusted to the desired state by providing the non-light-emission portions 23. This facilitates designing of the organic EL element 22, as compared to the case in which the brightness distribution is adjusted only by adjusting the resistance values of the connector portions 18.

A third embodiment of the present invention will hereafter be described with reference to FIGS. 6A and 6B. The third embodiment is different from the first embodiment in that a single connector portion is provided and the thickness of a portion of the connector portion differs continuously. The same or similar reference numerals are given to parts of the third embodiment that are the same or similar corresponding parts of the first embodiment, and the detailed explanation of these parts will be omitted. Further, also in the third embodiment, the organic EL element may be designed to have substantially uniform brightness distribution.

Figure 6A:
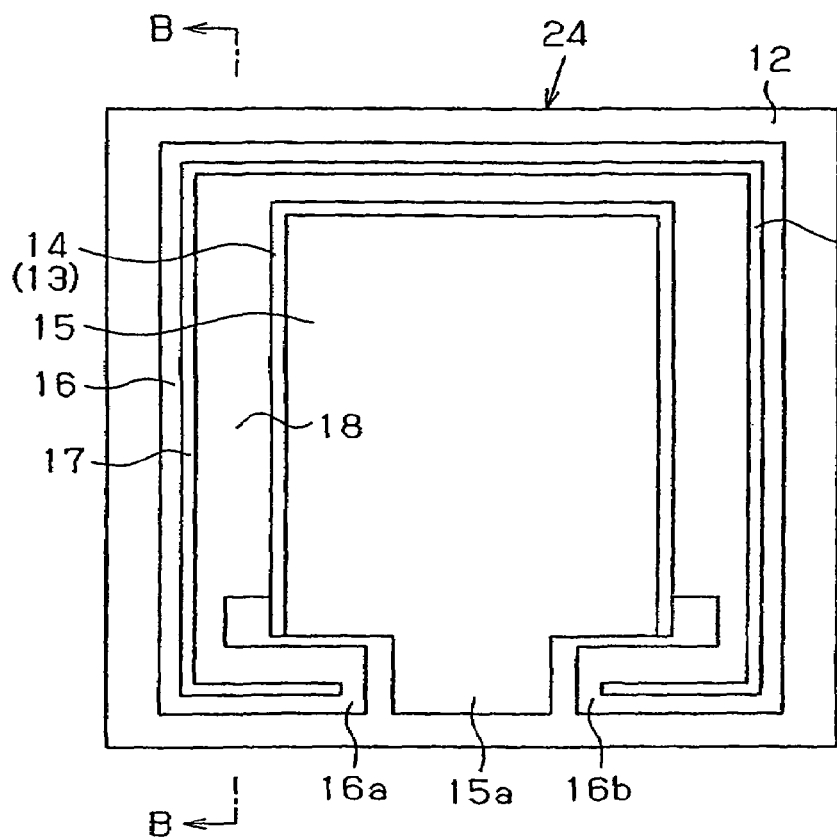
FIG. 6A is a plan view showing an organic EL element according to a third embodiment of the present invention.
Figure 6B:
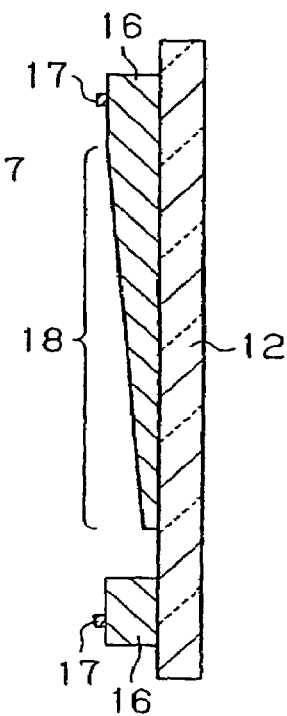
FIG. 6B is a cross-sectional view taken along line B-B of FIG. 6A.

FIG. 6A is a plan view showing an organic EL element 24 and FIG. 6B is a cross-sectional view taken along line B-B of FIG. 6A.

As shown in FIGS. 6A and 6B, the organic EL element 24 has a single connector portion 18 that connects the feeder portion 16 to the first electrode 13. The thicknesses of portions of the connector portion 18 corresponding to opposing left and right sides of the first electrode 13 vary continuously. For example, in the third embodiment, the thickness of each of these portions of the connector portion 18 becomes greater as the position farther from the corresponding terminal portion 16a, 16b. Such thickness becomes gradually smaller towards the terminal portion 16a, 16b. Thus, a resistance value per unit length of the connector portion 18 as measured along a direction in which the feeder portion 16 extends becomes lower as the position farther from the terminal portion 16a, 16b. Such value becomes higher as the position closer to the terminal portion 16a, 16b. In other words, the feeder portion 16 extends along one side of the first electrode 13. The resistance value of the connector portion 18 as measured along the direction in which the feeder portion 16 extends differs in correspondence with the positions of the connector portion 18 with respect to the extending direction of the feeder portion 16. Accordingly, the potentials of the outer circumferential portions of the first electrode 13 become substantially equal when the DC drive voltage is applied. The brightness distribution of the organic EL element 24 thus becomes substantially uniform.

To fabricate the connector portion 18 of the third embodiment, for example, an ITO film is deposited on the substrate 12 and then the connector portion 18 is subjected to etching or a known microfabrication method (a removal method) such as cutting by a machine in such a manner as to continuously vary the thickness of the connector portion 18.

The third embodiment has the following advantages in addition to the items (1) to (5) of the first embodiment.

(12) The organic EL element 24 includes the single connector portion 18. The thickness of the connector portion 18 differs in correspondence with the position at which the connector portion 18 connects the feeder portion 16 to the first electrode 13. Thus, by adjusting the thickness of the connector portion 18, the resistance value per unit length of the connector portion 18, as measured along the direction in which the feeder portion 16 extends, is adjusted. Accordingly, the brightness distribution of the organic EL element 24 is adjusted to the desired state.

(13) Since the connector portion 18 is formed as one continuous body, the potentials of the outer circumferential portions of the first electrode 13 are adjusted with improved accuracy compared to the first embodiment in which the connector portions 18 are formed as a plurality of separate bodies.

Next, a fourth embodiment of the present invention will be described referring to FIGS. 7 and 8. Also in this embodiment, an organic EL element is provided in such a manner that the brightness distribution of the organic EL element becomes substantially uniform.

Figure 7:
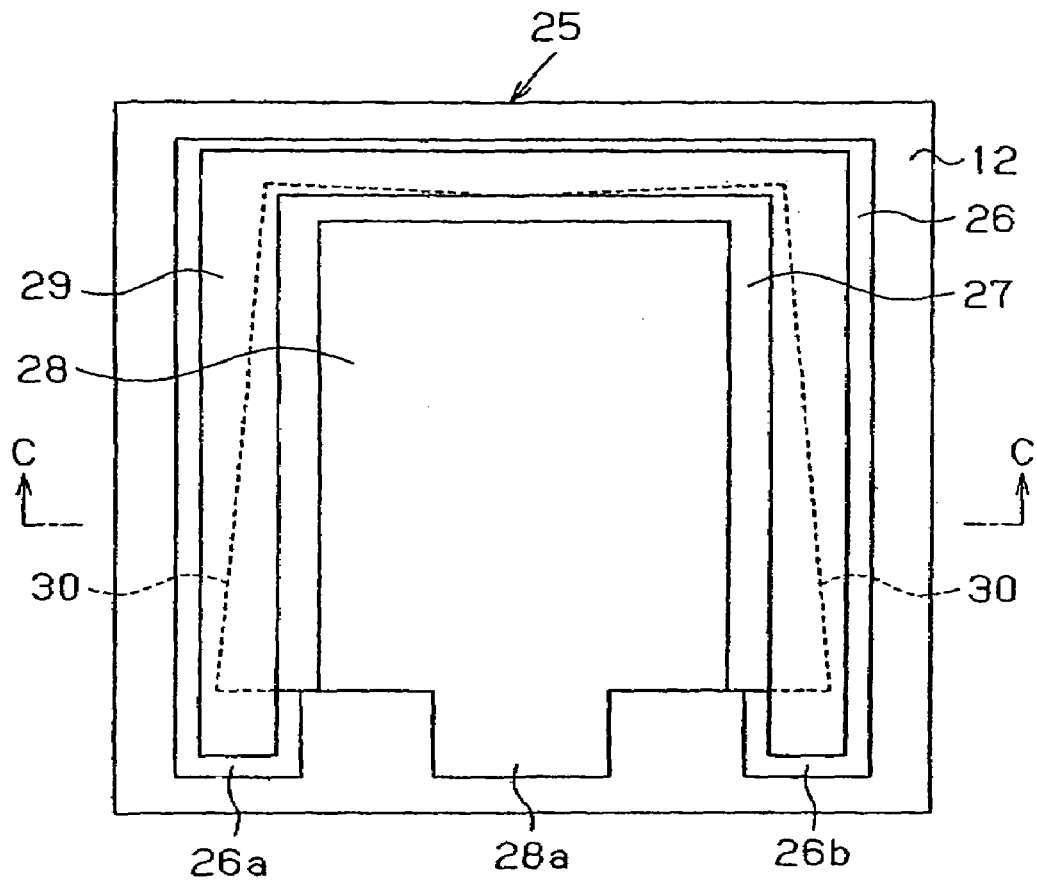
FIG. 7 is a plan view showing an organic EL element according to a fourth embodiment of the present invention.
Figure 8:
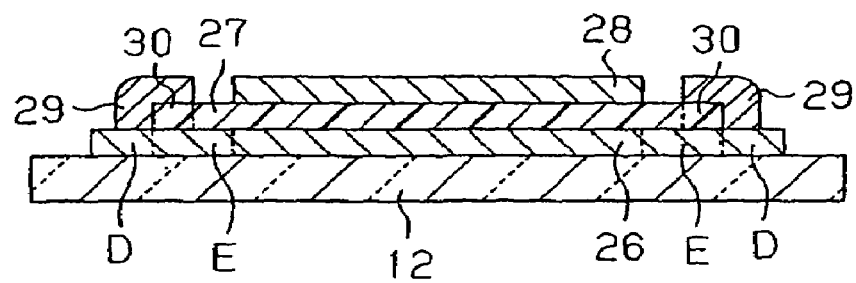
FIG. 8 is a cross-sectional view taken along line C-C of FIG. 7.

FIG. 7 is a plan view showing an organic EL element 25 and FIG. 8 is a cross-sectional view taken along line C-C of FIG. 7. Each of the drawings is only a schematic illustration and the components are shown in exaggerated dimensions for the illustrative purposes. The dimensional proportions of the components, including widths, lengths, and thicknesses, are thus not equal to the actual values.

As shown in FIGS. 7 and 8, the organic EL element 25 has a first conductive layer 26, an organic light emission layer 27 serving as a light emission layer, and a second conductive layer 28, which are deposited on the substrate 12 in this order. An auxiliary electrode layer 29 is provided on a portion of an outer circumferential portion of the first conductive layer 26. A high resistance portion 30 is arranged at positions between the first conductive layer 26 and the auxiliary electrode layer 29 on the circumference of the organic light emission layer 27. In other words, the high resistance portion 30 is located adjacent to a portion of the organic light emission layer 27 and is at positions between the first conductive layer 26 and the auxiliary electrode layer 29. The high resistance portion 30 extends along a part of circumference of the organic light emission layer 27. The first conductive layer 26 includes terminal portions 26a, 26b to which an external driver circuit (not shown) is connected. The second conductive layer 28 also has a terminal portion 28a. The high resistance portion 30 has a length along the aforementioned part of circumference of the organic light emission layer 27 and a width perpendicular to the length. The width (as viewed to the right or left in FIG. 7) of the high resistance portion 30, which is provided in correspondence with a portion of the organic light emission layer 27 between the first conductive layer 26 and the auxiliary electrode layer 29, differs in correspondence with the distance between the high resistance portion 30 and the corresponding terminal portion 26a, 26b of the first conductive layer 26. The width of the high resistance portion 30 is maximized at the position closest to the corresponding terminal portion 26a, 26b and becomes smaller as farther from the terminal portion 26a, 26b. The first conductive layer 26, the organic light emission layer 27, the second conductive layer 28, the auxiliary electrode layer 29, and the high resistance portion 30 each are formed to be symmetric with respect to the midline of the first conductive layer 26 in the direction defined by the width of the first conductive layer 26 (as viewed to the right or left in FIG. 7).

In the fourth embodiment, a portion of the first conductive layer 26 facing to the second conductive layer 28 corresponds to the first electrode of claim 1. A portion of the organic light emission layer 27 other than a portion corresponding to the auxiliary electrode layer 29 corresponds to the light emission layer of claim 1. The second conductive layer 28 corresponds to the second electrode of claim 1. The auxiliary electrode layer 29 and a portion D of the first conductive layer 26 shown in FIG. 8 (defined by a portion of the first conductive layer 26 held in contact with the auxiliary electrode layer 29 and a portion of the first conductive layer 26 which has no layer on upper side) corresponds to the feeder portion of Claim 1. A portion E of the first conductive layer 26 shown in FIG. 8 (defined by a portion of the first conductive layer 26 corresponding only to the organic light emission layer 27 and a portion of the first conductive layer 26 corresponding to the high resistance portion 30) corresponds to the connector portion of Claim 1. Since the width of the high resistance portion 30 differs in correspondence with the distance between the high resistance portion 30 and the corresponding terminal portion 26a, 26b, the width of the portion E differs correspondingly. Also, the resistance value per unit length of the portion E along the auxiliary electrode layer 29 differs similarly. These differences correspond to the difference of the resistance value of the connector portion in correspondence with the position at which the connector portion connects the feeder portion to the first electrode, as described in Claim 1.

The first conductive layer 26, the organic light emission layer 27, the second conductive layer 28, and the auxiliary electrode layer 29 are formed of the same materials as those of the first electrode 13, the organic light emission layer 14, the second electrode 15, and the auxiliary electrode 17 of the first embodiment, respectively. The high resistance portion 30 is formed of a material having a higher volume resistivity than that of the first conductive layer 26. In the fourth embodiment, the high resistance portion 30 is formed of the same material as that of the organic light emission layer 27. This allows the organic light emission layer 27 and the high resistance portion 30 to be formed continuously from each other.

As the width of the high resistance portion 30 differs in correspondence with the distance between the high resistance portion 30 and the corresponding terminal portion 26a, 26b, the width of the portion E of the first conductive layer 26 differs correspondingly. The first conductive layer 26 is formed of a material with a higher volume resistivity, such as ITO, than that of metal. Thus, in correspondence with the difference of the width of the portion E of the first conductive layer 26, the resistance value per unit length of the portion E along the auxiliary electrode layer 29 differs greatly. Therefore, adjustment of the width of the high resistance portion 30 adjusts the potentials of a portion of the first conductive layer 26 corresponding to the outer circumferential portion of the second conductive layer 28 generated in response to the DC drive voltage applied between the terminal portions 26a, 26b and the terminal portion 28a. For example, in the fourth embodiment, the resistance value per unit length of the portion E becomes higher at a position closer to the corresponding terminal portion 26a, 26b and lower at a position farther from the terminal portion 26a, 26b. Thus, the potentials of the portion of the first conductive layer 26 corresponding to the outer circumferential portion of the second conductive layer 28 become substantially equal. Accordingly, since the organic EL element 25 has a light emission zone corresponding to the second conductive layer 28, the organic EL element 25 has substantially uniform brightness distribution.

The organic EL element 25, which is configured as above-described, is formed by the following method. More specifically, the first conductive layer 26 is first deposited on the substrate 12. Then, the organic light emission layer 27 and the high resistance portion 30 are formed together on the first conductive layer 26 using a mask or the like, by a known thin film deposition method such as vacuum vapor deposition. Next, the second conductive layer 28 is provided on the organic light emission layer 27. Further, the auxiliary electrode layer 29 is provided in such a manner as to sandwich the high resistance portion 30 with the first conductive layer 26 and contact the first conductive layer 26. The first conductive layer 26, the organic light emission layer 27, the second conductive layer 28, the auxiliary electrode layer 29, and the like are formed by a known thin film deposition method, like the first embodiment.

The fourth embodiment has the following advantages.

(14) The organic EL element 25 includes the organic light emission layer 27 and the second conductive layer 28, which are provided on the first conductive layer 26 in this order. The material of the first conductive layer 26 has a higher volume resistivity than that of the material of the second conductive layer 28. The auxiliary electrode layer 29, which is formed of the material with a lower volume resistivity than that of the first conductive layer 26, is provided on a portion of the first conductive layer 26. Also, the high resistance portion 30, which is formed of the material with a higher volume resistivity than that of the first conductive layer 26, is provided at the positions between the first conductive layer 26 and the auxiliary electrode layer 29 on the circumference of the sides of the organic light emission layer 27. The width of the high resistance portion 30 differs in correspondence with the distance between the high resistance portion 30 and the corresponding terminal portion 26a, 26b of the first conductive layer 26. In the fourth embodiment, a current flows from the portion of the first conductive layer 26 corresponding to the auxiliary electrode layer 29 to the portion of the first conductive layer 26 corresponding to the second conductive layer 28. Adjustment of the width of the high resistance portion 30 adjusts the resistance value of the portion between the first conductive layer 26 corresponding to the auxiliary electrode layer 29 and the first conductive layer 26 corresponding to the second conductive layer 28. The potentials of the portion of the first conductive layer 26 corresponding to the outer circumferential portion of the second conductive layer 28 are thus adjusted. This adjusts the brightness distribution of the organic EL element 25 to the desired state.

(15) The high resistance portion 30 and the organic light emission layer 27 are formed of the same materials. The high resistance portion 30 and the organic light emission layer 27 are thus formed at one time when fabricating the organic EL element 25. This reduces the number of the steps of such fabrication.

(16) In the organic EL element 25, the high resistance portion 30 and the organic light emission layer 27 are formed continuously from each other. The high resistance portion 30 is thus provided relatively easily without using a mask that is complicatedly configured.

(17) The width of the high resistance portion 30 is set in such a manner that, when the DC drive voltage is applied between the terminal portions 26a, 26b and the terminal portion 28a, the potentials of the portion of the first conductive layer 26 corresponding to the outer circumferential portion of the second conductive layer 28 become substantially equal. The organic EL element 25 of this embodiment thus has the brightness distribution adjusted to the substantially uniform state.

A fifth embodiment of the present invention will hereafter be described with reference to FIGS. 9A and 9B. An organic EL element of the fifth embodiment is shaped differently from that of the first embodiment. The same or similar reference numerals are given to parts of the fifth embodiment that are the same or similar corresponding parts of the first embodiment, and the detailed explanation of these parts will be omitted. Further, also in the fifth embodiment, the organic EL element may be designed in such a manner that the brightness distribution becomes substantially uniform.

Figure 9A:
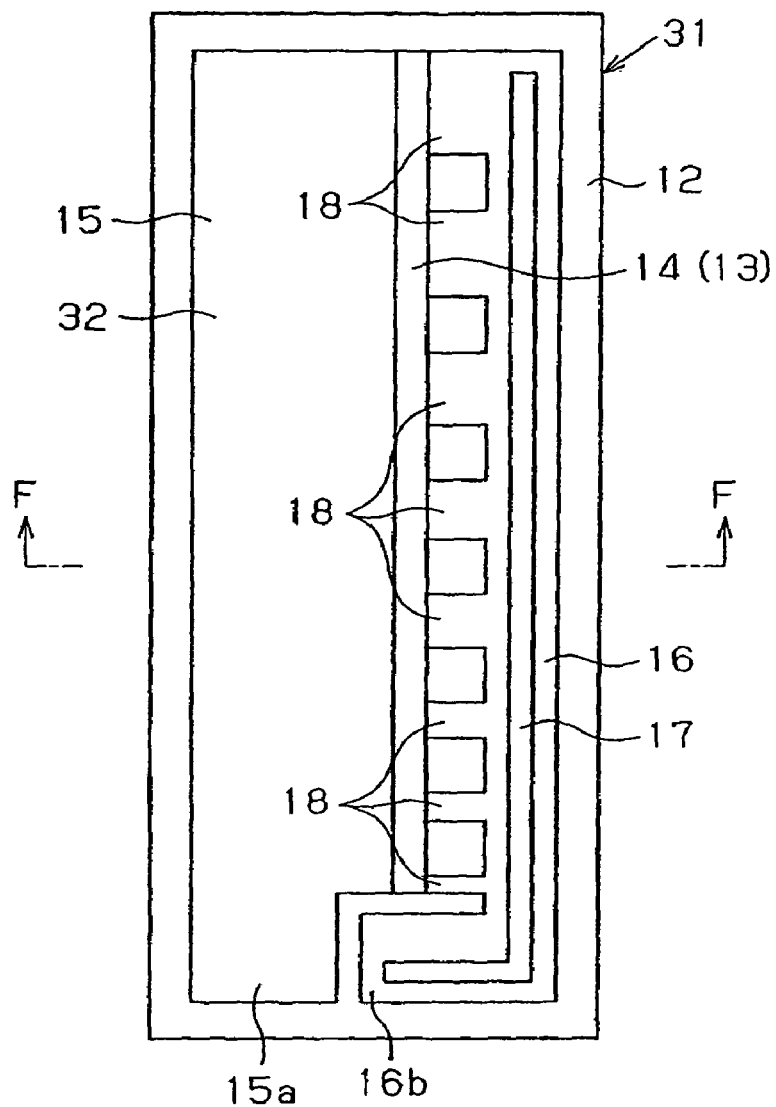
FIG. 9A is a plan view showing an organic EL element according to a fifth embodiment of the present invention.
Figure 9B:
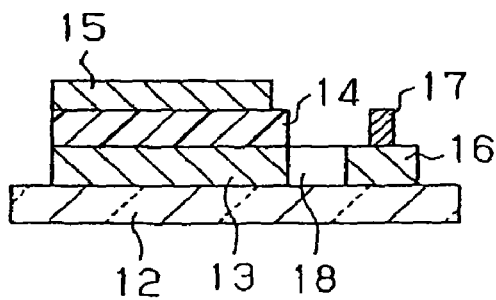
FIG. 9B is a cross-sectional view taken along line F-F of FIG. 9A.

FIG. 9A is a plan view showing an organic EL element 31 and FIG. 9B is a cross-sectional view taken along line F-F of FIG. 9A. Further, each of the drawings is only a schematic illustration and the components are shown in exaggerated dimensions for the illustrative purposes. The dimensional proportions of the components, including widths, lengths, and thicknesses, are thus not equal to the actual values.

As shown in FIG. 9A, the organic EL element 31 has an elongated rectangular outline, unlike the substantially square outline of the organic EL element 11 of the first embodiment. In other words, the organic EL element 31 has an elongated outline including at least one shorter side and a pair of longer sides, such as an elongated rectangular outline and an elongated trapezoidal outline. In the organic EL element 31, the first electrode 13, the organic light emission layer 14, and the second electrode 15, all of which have elongated outlines, are deposited on the substrate 12 in this order, thus forming an elongated light emission portion 32. The feeder portion 16 is provided only at a position opposed to one of the longer sides of the first electrode 13. The feeder portion 16 and the first electrode 13 are electrically connected to each other through a plurality of connector portions 18. The connector portions 18 have equal length and equal thickness. However, the widths of the connector portions 18 become greater as the connector portions 18 are farther from the terminal portion 16b. Such sizing of the connector portions 18 enables the side of the first electrode 13 opposed to the feeder portion 16 to have substantially equal potentials when the DC drive voltage is applied. The "length" of each connector portion 18 is defined as the distance between the feeder portion 16 and the first electrode 13. The "width" of the connector portion 18 is defined as the dimension of the connector portion 18 perpendicular to the direction defined by the length of the connector portion 18 (as viewed vertically in FIG. 9A).

As has been described, the first electrode 13 has the elongated shape including the shorter side and the longer side. In this case, the resistance value of a portion between a certain point on one of the longer sides and a point defined on a line extending in the extending direction of each shorter side becomes extremely small, compared to the resistance value of a corresponding current path as a whole. Thus, the elongated organic light emission layer 14, which is deposited on the first electrode 13, has substantially equal current densities at positions along the extending direction of each shorter side of the light emission layer 14. This suppresses brightness variation of the elongated light emission portion 32 in the extending direction of each shorter side of the light emission portion 32. Further, the brightness distribution of the light emission portion 32 in the extending direction of each longer side of the light emission portion 32 is adjusted in the same manner as described in the first embodiment. That is, the resistance values of the connector portions 18, each of which connects the feeder portion 16 to the first electrode 13, are adjusted so as to adjust the resistance value of each of the current paths from the terminal portion 16b to the contact portions between the first electrode 13 and the connector portions 18.

Accordingly, even with the feeder portion 16 provided only at the position opposed to one of the longer sides of the first electrode 13, the brightness distribution of the organic EL element 31 is adjusted to the desired state. Further, regardless of the elongated shape of the first electrode 13, the feeder portion 16 may be arranged in such a manner as to oppose the entire outer circumference of the first electrode 13.

The fifth embodiment has the following advantages.

(18) The organic EL element 31 has the elongated rectangular outline. Accordingly, the organic EL element 31 may be used in an apparatus that needs an elongated light source, thus providing the brightness distribution adjusted to the desired state.

(19) The first electrode 13 has the elongated outline and the feeder portion 16 is provided only at the position opposed to one of the longer sides of the first electrode 13. Thus, the resistance value of a portion between a certain point on the longer side of the first electrode 13 and a point defined on a line extending along the extending direction of each shorter side becomes extremely small, compared to the resistance value of a corresponding current path as a whole. This facilitates adjustment of the brightness distribution of the organic EL element 31, compared to a case in which the first electrode 13 is formed in a different and non-elongated shape, such as a square shape. Further, since the feeder portion 16 does not have to cover a wide range, the organic EL element 31 becomes easy to design and fabricate.

Now, a sixth embodiment of the present invention will be explained referring to FIGS. 10A and 10B. An organic EL element of the sixth embodiment is shaped differently from that of the fourth embodiment. The same or similar reference numerals are given to parts of the sixth embodiment that are the same or similar corresponding parts of the fourth embodiment, and the detailed explanation of these parts will be omitted. Further, also in the sixth embodiment, the organic EL element may be designed in such a manner that the brightness distribution becomes substantially uniform.

Figure 10A:
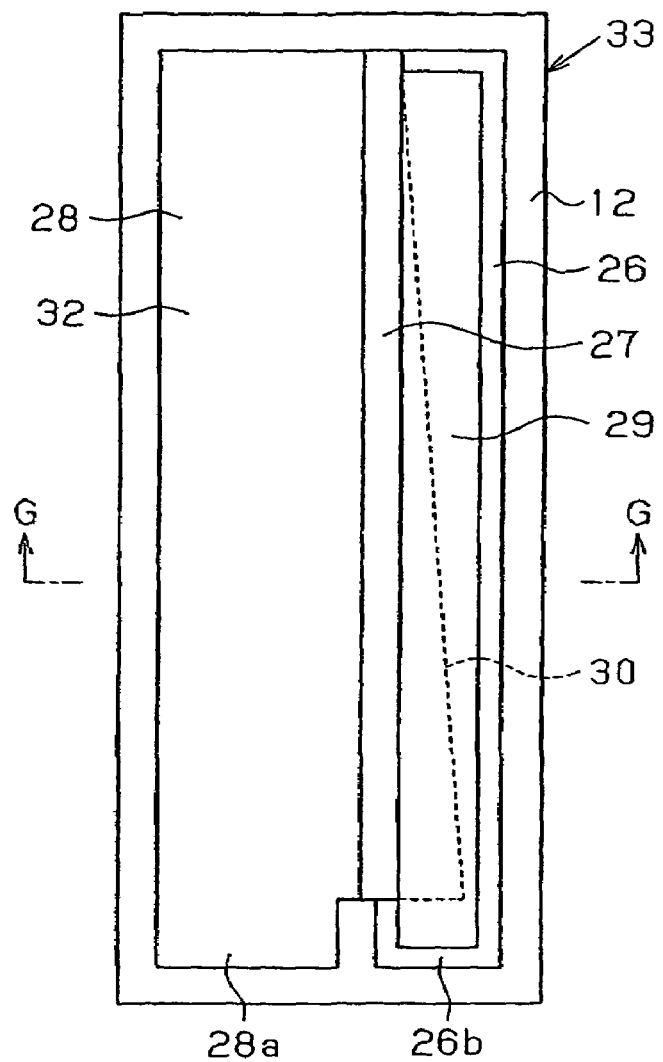
FIG. 10A is a plan view showing an organic EL element according to a sixth embodiment of the present invention.
Figure 10B:
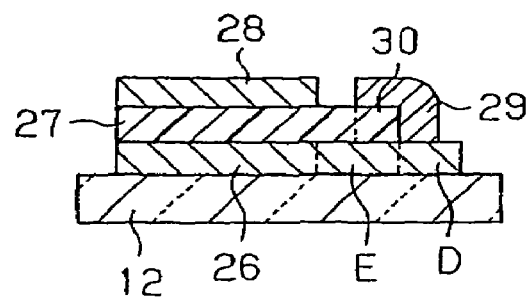
FIG. 10B is a cross-sectional view taken along line G-G of FIG. 10A.

FIG. 10A is a plan view showing an organic EL element 33 and FIG. 10B is a cross-sectional view taken along line G-G of FIG. 10A. Further, each of the drawings is only a schematic illustration and the components are shown in exaggerated dimensions for the illustrative purposes. The dimensional proportions of the components, including widths, lengths, and thicknesses, are thus not equal to the actual values.

As shown in FIG. 10A, the organic El element 33 has an elongate rectangular outline. In the organic EL element 33, the first conductive layer 26, the organic light emission layer 27 serving as the light emission layer, and the second conductive layer 28, all of which have elongated shapes, are deposited on the substrate 12 in this order, thus defining the elongated light emission portion 32. The auxiliary electrode layer 29 is formed at a position corresponding to one of the longer sides of the first conductive layer 26. The high resistance portion 30 is arranged at a position between the first conductive layer 26 and the auxiliary electrode layer 29 on one side of the organic light emission layer 27. The width (the dimension measured in the rightward or leftward direction in FIGS. 10A and 10B) of the high resistance portion 30 differs in correspondence with the distance between the high resistance portion 30 and the terminal portion 26b. This adjusts the brightness distribution of the organic EL element 33 to the substantially uniform state. More specifically, the width of the high resistance portion 30 is maximized at the position closest to the terminal portion 26b and becomes smaller at positions farther from the terminal portion 26b.

The first conductive layer 26 has the elongated outline including the shorter side and the longer side. In this case, the resistance value of a portion between a certain point on one of the longer sides of the first conductive layer 26 to a point defined on a line along the extending direction of each shorter side becomes extremely small compared to the resistance value of a corresponding current path as a whole. Thus, the elongated organic light emission layer 27, which is deposited on the first conductive layer 26, has substantially equal current densities at positions along the extending direction of each shorter side of the organic light emission layer 27. This suppresses distribution variation of the elongated light emission portion 32 in the extending direction of each shorter side of the light emission portion 32. The brightness distribution of the light emission portion 32 in the extending direction of each longer side of the light emission portion 32 is adjusted in the same manner as the fourth embodiment. That is, the width of the high resistance portion 30 between the first conductive layer 26 and the auxiliary electrode layer 29 is adjusted so as to adjust the resistance value of each of the current paths from the terminal portion 26b to the portions of the first conductive layer 26.

Therefore, even though the auxiliary electrode layer 29 and the high resistance portion 30 are provided only at the position corresponding to one of the longer sides of the first conductive layer 26, the brightness distribution of the organic EL element 33 is adjusted to the desired state. Further, regardless of the elongated shape of the first conductive layer 26, the auxiliary electrode layer 29 and the high resistance portion 30 may be provided along the entire outer circumference of the first conductive layer 26.

The sixth embodiment has the following advantages.

(20) The organic EL element 33 has an elongated rectangular shape. Accordingly, the organic EL element 33 may be used in an apparatus that needs an elongated light source, thus providing the brightness distribution adjusted to the desired state.

(21) The first conductive layer 26 has the elongated outline and the auxiliary electrode layer 29 and the high resistance portion 30 are provided only at the position opposed to one of the longer sides of the first conductive layer 26. Thus, the resistance value of a portion between a certain point on one of the longer sides of the first conductive layer 26 and a point defined on a line extending along the extending direction of each shorter side becomes extremely small, compared to the resistance value of a corresponding current path as a whole. This facilitates adjustment of the brightness distribution of the organic EL element 33 compared to a case in which the first conductive layer 26 is formed in a different and non-elongated shape, such as a square shape. Further, since the auxiliary electrode layer 29 and the high resistance portion 30 do not have to cover a wide range, the organic EL element 33 becomes easy to design and fabricate.

It should be apparent to those skilled in the art that the present invention may be embodied in many other specific forms without departing from the spirit or scope of the invention. Particularly, it should be understood that the invention may be embodied in the following forms.

As shown in FIG. 11A, the feeder portion 16 may be connected to the first electrode 13 through a plurality of connector portions 18 having equal width, equal length, and equal thickness. In this case, the number of the connector portions 18 per unit length L along the vertical direction of the first electrode 13 in FIG. 11A differs in correspondence with positions defined in the first electrode 13. In other words, the connector portions 18 are divided into a plurality of groups in correspondence with the unit lengths L. Each of the groups includes one or more connector portions 18. The connector portions 18 have uniform shapes, regardless of which of the groups the connector portions 18 belong to. The number of the connector portions 18 differs from group to group. In this case, by differing the number of the connector portions 18 per unit length L, the potentials of the corresponding connection area in which the first electrode 13 is connected to the connector portions 18 are adjusted. In this manner, the brightness distribution of the organic EL element becomes substantially uniform. In FIG. 11A, the terminal portion 16a is located at a lower position of the drawing. The drawing illustrates the arrangement of the connector portions 18 that substantially equalizes the potentials at the side of the first electrode 13 opposed to the feeder portion 16 when the DC drive voltage is applied.

As shown in FIG. 11B, the connector portions 18 connecting the feeder portion 16 to the first electrode 13 may have equal width, equal thickness, but different lengths. In this case, by adjusting the lengths of the connector portions 18, the potentials of the connection areas in which the corresponding connector portions 18 are connected to the first electrode 13 are adjusted. In this manner, the brightness distribution of the organic EL element is adjusted to the desired state. In FIG. 11B, the terminal portion 16a is located at a lower position of the drawing. The drawing illustrates the arrangement of the connector portions 18 that substantially equalizes the potentials at the side of the first electrode 13 opposed to the feeder portion 16 when the DC drive voltage is applied.

The feeder portion 16 and the first electrode 13 may be connected to each other through a plurality of connector portions 18. The resistance values of the connector portions 18 are different by differing the shapes of the connector portions 18. In this case, the shapes of the connector portions 18 may be modified by differing at least one of the width, lengths and thickness of each of the connector portions 18. For example, the length and thickness of the connector portions 18 may be different with the width maintained uniform. Alternatively, the width and thickness of the connector portions 18 may be different with the length maintained uniform. Further, the width and length of the connector portions 18 may be different with the thickness maintained uniform. Also, all of the width, length, and thickness of the connector portions 18 may be different.

The width of the feeder portion 16, which is arranged in the outer circumferential portion of the first electrode 13, does not have to be uniform. For example, even if the distance (the interval) between the feeder portion 16 and the first electrode 13 is uniform, the width of the feeder portion 16 may be non-uniform, referring to FIG. 11B. Further, the feeder portion 16 may have a uniform width and a non-uniform thickness. Alternatively, the feeder portion 16 may have neither the uniform width nor the uniform thickness.

The auxiliary electrode 17, which is provided in the feeder portion 16, may be shaped in any suitable manners as long as the auxiliary electrode 17 does not short-circuit with the second electrode 15. For example, if the width of the feeder portion 16 is non-uniform as shown in FIG. 11B, the auxiliary electrode 17 may also have a non-uniform width.

The auxiliary electrode 17, which is provided in the feeder portion 16, does not have to have a shape matching the shape of the feeder portion 16. For example, the auxiliary electrode 17 having a uniform width may be arranged diagonally with respect to the feeder portion 16 of FIG. 11A.

The feeder portion 16 does not have to be arranged along the entire outer circumference of the first electrode 13. For example, referring to FIGS. 11A and 11B, the feeder portion 16 may be provided in correspondence with only a portion of the outer circumferential portion of the first electrode 13.

The organic EL element of the second embodiment may have an elongated outline, like an organic EL element 34 of FIG. 12. FIG. 12 is a plan view showing the organic EL element 34 from which the organic light emission layer 14 and the second electrode 15 are removed. The drawing illustrates a state in which the brightness distribution of the organic EL element 34 becomes substantially uniform. The feeder portion 16 is provided only at a position opposed to one of the longer sides of the first electrode 13. The connector portions 18 connect the feeder portion 16 to the first electrode 13. In this embodiment, adjustment of the brightness distribution of the organic EL element 34 is performed by adjusting the resistance values of the connector portions 18 and providing the non-light-emission portions 23, in combination. In this manner, the brightness distribution is adjusted further to the desired state. The organic EL element 34 of FIG. 12 may be used in an apparatus that needs an elongated light source, thus providing the brightness distribution adjusted to the desired state.

Figure 13A:
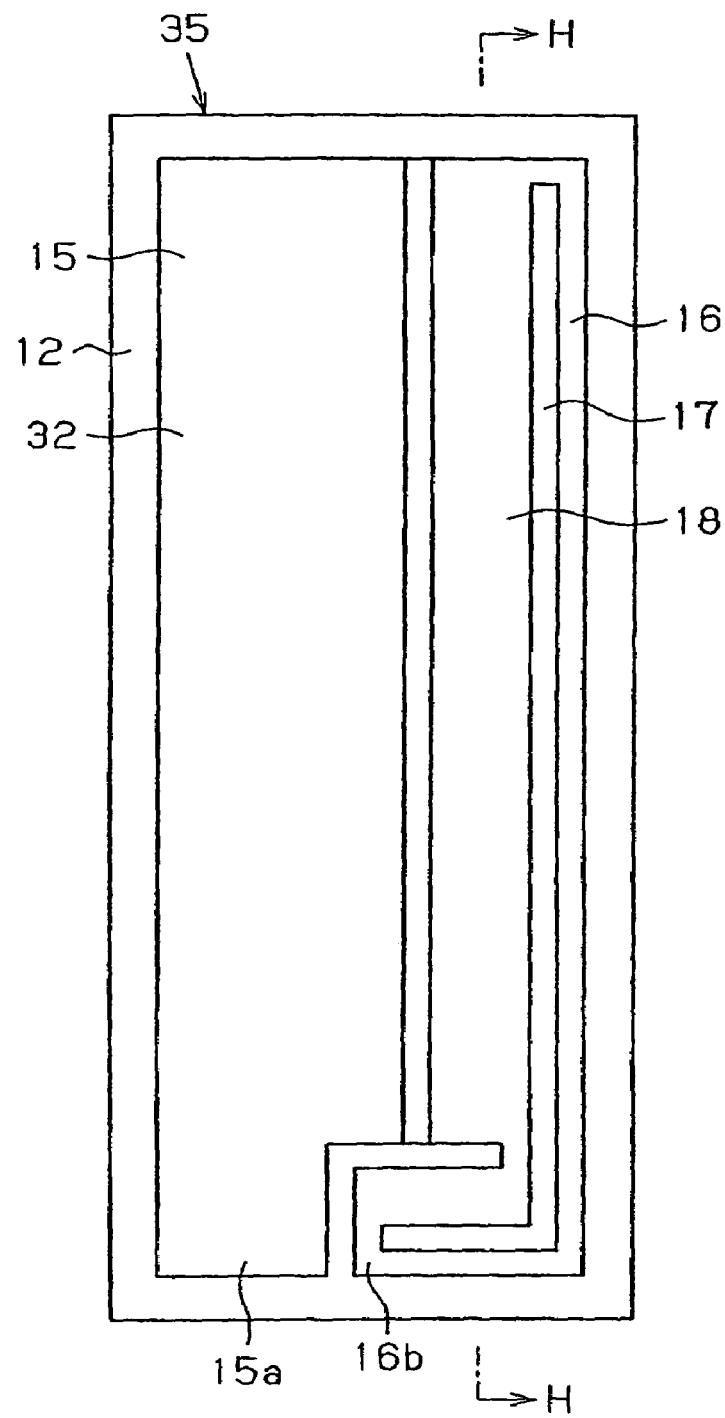
FIG. 13A is a plan view showing an organic EL element according to another embodiment of the present invention.
Figure 13B:
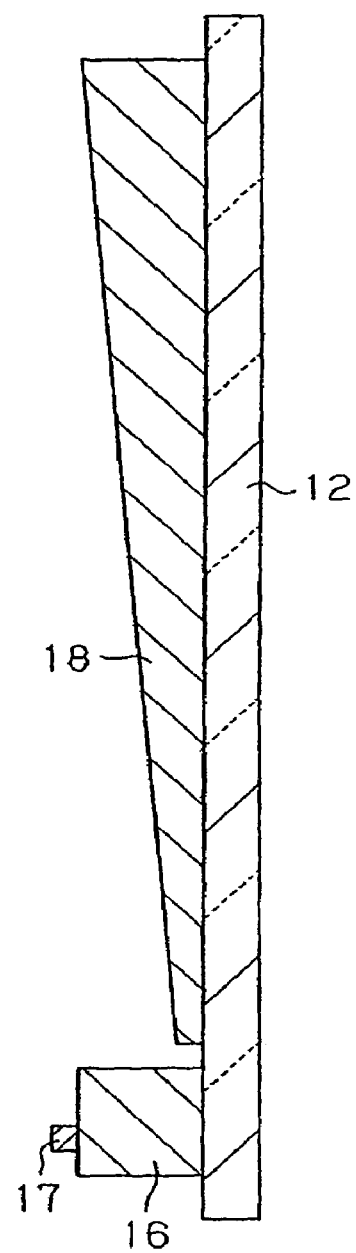
FIG. 13B is a cross-sectional view taken along line H-H of FIG. 13A.

The organic EL element of the third embodiment may have an elongated outline, like an organic EL element 35 of FIGS. 13A and 13B. FIG. 13A is a plan view showing the organic EL element 35 and FIG. 13B is a cross-sectional view taken along line H-H of FIG. 13A. The drawings illustrate a state in which the brightness distribution becomes substantially uniform. In the organic EL element 35, the feeder portion 16 and the first electrode 13 are connected to each other through the single connector portion 18. The feeder portion 16 is provided at a position opposed to one of the longer sides of the first electrode 13, which also has an elongated outline. The thickness of the connector portion 18 continuously differs in correspondence with the distance between the connector portion 18 and the terminal portion 16b. To obtain substantially uniform brightness distribution, for example, the connector portion 18 may be shaped as shown in FIG. 13B. That is, the thickness of the connector portion 18 becomes greater as the position farther from the terminal portion 16b and smaller at positions closer to the terminal portion 16b. Also in this case, the organic EL element 35 may be used in an apparatus that needs an elongated light source, thus providing the brightness distribution adjusted to the desired state.

The elongated organic EL elements of FIGS. 9, 10, 12, and 13 do not have to have a single terminal portion but may include a plurality of terminal portions. This further facilitates the adjustment of the brightness distribution of each organic EL element.

Figure 14:
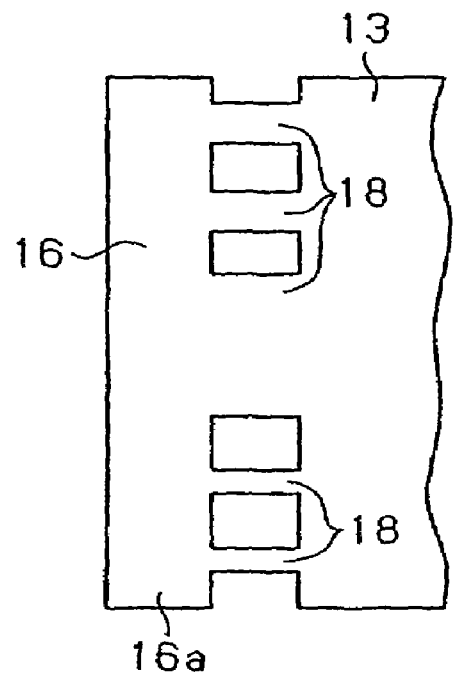
FIG. 14 is a plan view showing a portion including a feeder portion, a first electrode, and connector portions according to another embodiment of the present invention.
Figure 15:
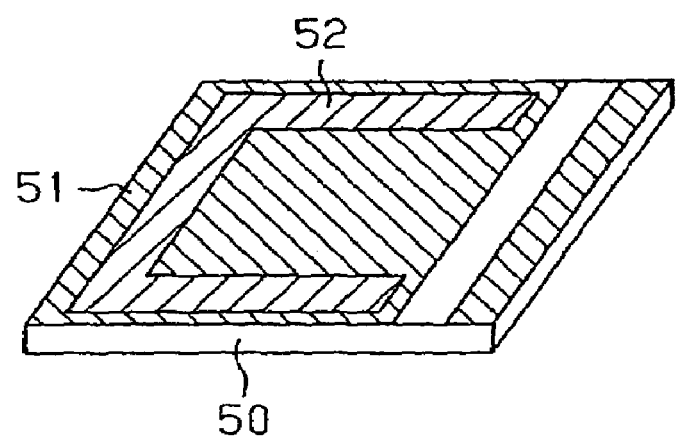
FIG. 15 is a perspective view showing a prior-art organic EL element.

In the illustrated embodiments, the connector portions 18 are adjusted in such a manner that the brightness distribution becomes substantially uniform. However, the brightness distribution may become non-uniform at a certain position (in a certain area) of the light emission zone of each organic EL element. For example, a plurality of connector portions 18 may be arranged as shown in FIG. 14, in which the terminal portion 16a is located at a lower position. In this case, when the DC drive voltage is applied, the brightness of the organic EL element becomes low at positions close to and separate from the terminal portion 16a. The brightness of an intermediate area between these positions becomes relatively high.

The width of the high resistance portion 30 is adjusted in such a manner that the brightness distribution of the organic EL element becomes substantially uniform. Alternatively, the width of the high resistance portion 30 may be adjusted in such a manner that the brightness distribution may become non-uniform at a certain position (in a certain area) of the light emission zone of the element. That is, unlike the arrangement of FIG. 7 in which the high resistance portion 30 is provided continuously along the auxiliary electrode layer 29, the high resistance portion 30 may be formed along the auxiliary electrode layer 29 in a discontinuous manner. In this case, the brightness distribution becomes non-uniform.

The material of the first electrode 13 is not restricted to ITO but may be any suitable substance as long as the material has a higher volume resistivity than that of the second electrode 15 and is conductive. That is, the first electrode 13 may be formed of, for example, metal oxide such as IZO (indium zinc oxide), ZnO (zinc oxide), and tin oxide.

The second electrode 15 does not have to be formed of aluminum. The material of the second electrode 15 may be any suitable substance as long as the material has a lower volume resistivity than that of the first electrode 13 and is conductive. That is, the second electrode 15 may be formed of, metal such as gold, silver, copper, and chrome and alloys of these metals.

The second electrode 15 does not have to reflect the visible light.

The auxiliary electrode 17 does not have to be formed of aluminum. The material of the auxiliary electrode 17 may be any suitable substance as long as the material is conductive and has a lower volume resistivity than that of the feeder portion 16.

In the illustrated embodiments, the connector portions 18 are formed of the same materials as that of the first electrode 13. However, the connector portions 18 may be formed of any suitable material that is conductive and has a higher volume resistivity than that of the metal forming the auxiliary electrode 17. For example, the connector portions 18 may be formed of IZO, ZnO, or tin oxide, if the first electrode 13 is formed of ITO.

Although the feeder portion 16 is formed of the same material as that of the first electrode 13 in the illustrated embodiments, the feeder portion 16 may be formed of a material different from that of the first electrode 13 as long as the material is conductive. For example, the feeder portion 16 may be formed of aluminum, gold, silver, copper, or chrome, the same material as that of the second electrode 15.

Although the auxiliary electrode 17 is mounted on the feeder portion 16 in the illustrated embodiments, the auxiliary electrode 17 may not be provided in the feeder portion 16.

The feeder portion 16 may include the terminal portion for connecting the feeder portion 16 to the external driver circuit at any suitable position other than the ends of the feeder portion 16. The shape of the connector portion is adjusted in correspondence with the distance between the connector portion and the terminal portion in such a manner as to adjust the brightness distribution of the organic EL element to the desired state.

The electron injection layer formed of inorganic matter, which is arranged between the organic light emission layer 14 and the second electrode 15, may be omitted. Further, an electron injection layer formed of organic matter may be provided in the organic light emission layer 14.

The organic light emission layer 14 does not have to consist of the hole injection layer 19, the hole transport layer 20, and the light emission layer 21. The organic light emission layer 14 may be formed by a light emission layer independently or as stacked with at least one of a hole injection layer, a hole transport layer, a hole injection transport layer, a hole blocking layer, an electron injection layer, an electron transport layer, and an electron blocking layer.

In the illustrated embodiments, the organic light emission layer 14 emits the white light. However, the organic light emission layer 14 may emit the red light, the green light, the blue light, or the yellow light independently or in combination with any one(s) of these colors.

The first electrode 13, the organic light emission layer 14, the second electrode 15, the passivation film and the like are each formed by a known thin film deposition method.

The material of the high resistance portion 30 is not restricted to the material of the organic light emission layer 27. The high resistance portion 30 may be formed of any suitable material as long as the volume resistivity of the material is higher than that of the first conductive layer 26. Therefore, the high resistance portion 30 may be formed of, for example, insulating material. If the material of the high resistance portion 30 is different from that of the organic light emission layer 27, the high resistance portion 30 and the organic light emission layer 27 must be formed separately from each other.

The high resistance portion 30 and the organic light emission layer 27 do not have to be continuous from each other.

In the illustrated embodiments, the non-light-emission portions 23 are defined by the openings provided in the first electrode 13. However, the openings that define the non-light-emission portions 23 may be provided in the organic light emission layer 14 or the second electrode 15. Alternatively, the non-light-emission portions 23 may be defined by arranging an insulating material between one of the electrodes and the organic light emission layer 14.

In the illustrated embodiments, each of the organic EL elements is of a bottom emission type. However, the present invention may be applied to a top emission type organic EL element. In this case, the substrate 12 may be formed of non-transparent material and the second electrode 15 is formed of transparent metal. The transparency herein is defined as 10 percent or more of visible light transmission rate.

The substrate 12 does not have to be formed of glass. If the organic EL element is of a bottom emission type, the substrate 12 may be formed of any suitable material as long as the material is transparent. That is, the substrate 12 may be formed of transparent resin such as acrylic resin. Further, if the organic EL element is of a top emission type, a non-transparent substrate formed of silicon or metal may be employed. Alternatively, if the organic EL element is of a top emission type and employs a transparent substrate, a reflection member is arranged on the substrate, for example.

The present invention is not restricted to an organic EL element having an organic layer as a light emission layer but may be applied to an inorganic EL element having an inorganic layer as a light emission layer.

Therefore, the present examples and embodiments are to be considered as illustrative and not restrictive and the invention is not to be limited to the details given herein, but may be modified within the scope and equivalence of the appended claims.

What is claimed is:

1. An electroluminescence element comprising:
a first electrode;
a second electrode, the first electrode being formed of a material having a higher volume resistivity than that of a material forming the second electrode;
a light emission layer arranged between the first electrode and the second electrode;
a feeder portion having a terminal portion that can be connected to an external driver circuit; and
a plurality of connector portions for electrically connecting the feeder portion to the first electrode, the resistance values of the connector portions becoming smaller as the connector portions are more spaced from the terminal portions.

2. The element according to claim 1, wherein the feeder portion extends along one side of the first electrode.

3. The element according to claim 1, wherein the connector portion is formed of the same material as the material of the first electrode.

4. The element according to claim 1, wherein the feeder portion is formed of the same material as the material of the first electrode.

5. The element according to claim 1, wherein the feeder portion includes an auxiliary electrode formed of a material having a lower volume resistivity than that of the material of the feeder portion.

6. The element according to claim 1, wherein each of the connector portions has a length from the feeder portion to the first electrode and a width perpendicular to the length, and
wherein the connector portions have equal length and different widths.

7. The element according to claim 1, wherein each of the connector portions has at least one conductive body, the conductive bodies of the connector portions being shaped identically, the number of the conductive bodies being different from connector portion to connector portion.

8. The element according to claim 1, wherein the feeder portion and the connector portion are arranged in such a manner that the electroluminescence element has substantially uniform brightness distribution as a whole.

9. The element according to claim 1, wherein the electroluminescence element has an elongated shape.

10. The element according to claim 9, wherein the first electrode has a pair of shorter sides and a pair of longer sides, the feeder portion being arranged only at a position opposed to one of the longer sides of the first electrode.

11. The element according to claim 1, further comprising a non-light-emission portion provided in a light emission zone where the first and second electrodes overlap.

12. The element according to claim 11, wherein the non-light-emission portion is one of a plurality of non-light-emission portions, the non-light-emission portions being arranged in such a manner as to adjust brightness distribution of the electroluminescence element to a desired state.

13. The element according to claim 1, wherein the electroluminescence element is an area light-emitting element.

14. The element according to claim 1, wherein the electroluminescence element is employed as a backlight of a display.

15. An electroluminescence element comprising:
a first conductive layer having a terminal portion that can be connected to an external driver circuit;

a light emission layer deposited on the first conductive layer;

a second conductive layer formed on the light emission layer, the first conductive layer being formed of a material having a higher volume resistivity than that of a material forming the second conductive layer;

an auxiliary electrode layer provided in correspondence with a portion of the first conductive layer, the auxiliary electrode layer being formed of a material having a lower volume resistivity than that of the material of the first conductive layer; and a high resistance portion formed of a material having a higher volume resistivity than that of the material of the first conductive layer, wherein the high resistance portion is arranged between the first conductive layer and the auxiliary electrode layer and adjacent to a portion of the light emission layer, the high resistance portion extending a long a side of the light emission layer, and wherein the high resistance portion has a length defined along a direction in which the side of the light emission layer extends and a width perpendicular to the length, the width of the high resistance portion differing in correspondence with the distance between the high resistance portion and the terminal portion.

16. The element according to claim 15, wherein the high resistance portion is formed of the same material as a material forming the light emission layer.

17. The element according to claim 16, wherein the high resistance portion is formed continuously from the light emission layer.

18. The element according to claim 15, wherein the high resistance portion is arranged in such a manner that brightness distribution of the electroluminescence element becomes substantially uniform as a whole.

19. The element according to claim 15, wherein the electroluminescence element has an elongated shape.

20. The element according to claim 19, wherein the first conductive layer includes a pair of shorter sides and a pair of longer sides, and wherein the auxiliary electrode layer and the high resistance portion are provided on only one of the longer sides of the first conductive layer.

21. An electroluminescence element comprising:

a first electrode;

a second electrode, the first electrode being formed of a material having a higher volume resistivity than that of a material forming the second electrode;

a light emission layer arranged between the first electrode and the second electrode;

a feeder portion having a terminal portion that can be connected to an external driver circuit; and a connector portion for electrically connecting the feeder portion to the first electrode, the connector portion extending along one side of the first electrode, the thickness of the connector portion becoming greater at positions more spaced from the terminal portion.

* * * * *